(12) United States Patent
Wang et al.

(10) Patent No.: US 6,524,909 B1
(45) Date of Patent: Feb. 25, 2003

(54) SELF-ALIGNED FABRICATING PROCESS AND STRUCTURE OF SOURCE LINE OF ETOX FLASH MEMORY

(75) Inventors: Ling-Sung Wang, Hsinchu (TW); Jyh-Ren Wu, Taipei (TW)

(73) Assignee: Worldwide Semiconductor Manufacturing Corp., Hsinchu (TW)

( * ) Notice: Subject to any disclaimer, the term of this patent is extended or adjusted under 35 U.S.C. 154(b) by 0 days.

(21) Appl. No.: 09/494,524

(22) Filed: Jan. 31, 2000

(30) Foreign Application Priority Data

Dec. 31, 1999 (TW) ........................................ 88123395 A

(51) Int. Cl.⁷ ............................................ H01L 21/336
(52) U.S. Cl. ........................................ 438/257; 438/264
(58) Field of Search ................................ 438/296, 253, 438/254, 256, 257, 264, 267, 279, 399, 269

(56) References Cited

U.S. PATENT DOCUMENTS 6,211,012 B1 * 4/2001 Lee et al. .................. 438/257
6,277,693 B1 * 8/2001 Chen ......................... 438/264

* cited by examiner

*Primary Examiner*—David Nelms
*Assistant Examiner*—Phuc T. Dang
(74) *Attorney, Agent, or Firm*—J.C. Patents

(57) ABSTRACT

A self-aligned fabricating process and a structure of ETOX flash memory. A plurality of parallel lines for device isolation is formed in a substrate, and then forming a plurality of parallel stacked gates above the substrate. The device isolation lines and the stacked gates are perpendicular to each other. A plurality of first insulation layers is formed such that an insulation layer is formed over each stacked gate. Spacers are also formed over the sidewalls of each stacked gate. A plurality of source arrays and drain arrays are formed in the substrate between neighboring stacked gates. The source and drain arrays are parallel to the stacked gates, with a source array and a drain array formed in alternating positions between the stacked gates. Each source array comprises a plurality of source-doped regions located between the device isolation lines respectively. Similarly, each drain array has a plurality of drain-doped regions located between the device isolation lines. A plurality of source lines is formed in the space between neighboring spacers above the source array.

8 Claims, 6 Drawing Sheets

SELF-ALIGNED FABRICATING PROCESS AND STRUCTURE OF SOURCE LINE OF ETOX FLASH MEMORY

CROSS-REFERENCE TO RELATED APPLICATION

This application claims the priority benefit of Taiwan application serial no. 88123395, filed Dec. 31, 1999.

BACKGROUND OF THE INVENTION

1. Field of the Invention

The present invention relates to a method and a structure of a flash memory. More particularly, the present invention relates to a self-aligned fabricating process and a structure of a source line of an ETOX memory.

2. Description of the Related Art

ETOX flash memory is a type of conventional erasable programmable read only memory (EPROM) that also incorporates a thin tunnel oxide structure. In fact, ETOX is the acronym for EPROM with tunnel oxide.

FIG. 1 is a schematic top view showing a portion off an ETOX flash memory unit. FIG. 2A is a schematic, cross-sectional side view taken along line A–A' in the central region II of FIG. 1. FIG. 2B is another schematic, cross-sectional view along line B–B' in the same central region II of FIG. 1. As shown in FIGS. 1, 2A and 2B, the ETOX memory structure is formed by forming a field oxide (FOX) layer 110 in a silicon substrate 100 with the field oxide layer 110 serving as a device isolation structure. A tunnel oxide layer 120, a floating gate 130, an oxide/nitride/oxide (ONO) composite dielectric layer 140 and a control gate 150 are sequentially formed over the silicon substrate 100. The floating gate 130, the ONO dielectric layer 140 and the control gate 150 together constitute a stacked gate. An ion implantation is carried out, implanting ions into the substrate 100 on each side of the stacked gate to form a source line 160 and a drain terminal 170. Bit line contact 180 is also formed in the drain 170 region so that bit line (not shown in the figure) running over the stacked gate can be electrically connected to the drain 170. The bit line runs in a direction parallel to the field oxide layer 110, and is therefore perpendicular to the stacked gate. The source line 160 runs in a direction perpendicular to the field oxide layer 110, and is therefore parallel to the stacked gate.

During the fabrication of an ETOX memory unit, the polysilicon is first deposited over the substrate 100 and then patterned to form a first polysilicon layer 130a as shown in FIG. 3. An ONO dielectric layer 140 is formed over the surface of the first polysilicon layer 130a. A second polysilicon layer is next formed over the silicon substrate 100, and then a self-aligned etching operation is conducted to pattern the second polysilicon layer, the ONO dielectric layer 140 and the first polysilicon layer 130a. Hence, a stacked gate consisting of the floating gate 130, the ONO dielectric layer 140 and the control gate 150 as shown in FIGS. 1, 2A and 2B is formed.

In the self-aligned etching process, the area 190a on the silicon substrate 100 is only covered by a layer of polysilicon (a second polysilicon layer). Therefore, after etching the second polysilicon layer, the ONO dielectric layer 140 and the first polysilicon layer 130a, an opening 190 (shown in FIG. 1) is also formed in area 190a of the silicon substrate 100.

FIGS. 4A and 4B are schematic, cross-sectional views along line IV–IV' of FIG. 1. After the self-aligned etching process as shown in FIG. 4A, ions from an ion source 200 are implanted into the source line 160 region to form an ion-doped region 210 as shown in FIG. 4B. Since ions are generally implanted in a direction perpendicular to the silicon substrate 100, a very thin ion-doped layer 210a is formed next to the sidewalls of the opening 190. Consequently, discontinuity and high resistance may occur somewhere along the source line 160.

A number of problems may occur if the source line 160 has a high electrical resistance. Operating speed of an ETOX memory cell may decrease. Resistance of the source line 160 can be lowered by either increasing the line width w (as shown in FIG. 1) or increasing the concentration of ion dopants inside the source line 160. However, increasing the width w of the source line 160 will lower the level of integration. On the other hand, increasing dopant concentration will increase band-to-band tunneling current leading an intensification of current leak problems. In addition, when resistance of the source line 160 is high, a source line contact (not shown in the figure) for every 32 memory bits is essential, thereby lowering the level of integration for ETOX flash memory even further.

A related problem is that field oxide near the bird's beak area is rather thin. Hence, according to the design rule, a distance must be set aside between the 'close' state stacked gate from the edge of the field oxide layer 110 to prevent current leak. However, by designating a minimum distance of separation, ultimate level of integration for the ETOX flash memory is further reduced.

SUMMARY OF THE INVENTION

The invention provides a self-aligned process for fabricating ETOX flash memory. A plurality of parallel lines for device isolation is formed in a substrate, and then a plurality of parallel stacked gates perpendicular to the isolation lines is formed.

A plurality of first insulation layers is formed with an insulation layer above each stacked gate. Spacers are formed over the sidewalls of each stacked gate. At least one source line array is formed in the substrate running parallel to the stacked gates and located between neighboring stacked gates. This source line array comprises a plurality of source-doped regions between the device isolation lines. A second insulation layer is formed over the substrate, and then a line opening is formed in the second insulation layer to expose the device isolation line and the source-doped region cross-over by the source line array. A source line is finally formed inside the opening.

The invention also provides a source line structure for ETOX flash memory. The structure comprises a substrate, a plurality of parallel device isolation lines in the substrate, a plurality of parallel stacked gates perpendicular to the device isolation lines over the substrate, a plurality of first insulation layers, one over each of the stacked gate, and a plurality of spacers on the sidewalls of the stacked gates. In addition, there is a plurality of source line arrays and drain line arrays in the substrate running parallel to the stacked gates and formed between two neighboring stacked gates. The source arrays and the drain arrays alternate in the area between the stacked gates, and each source array comprises a plurality of source-doped regions positioned between the device isolation lines. Similarly, each drain array comprises a plurality of drain-doped regions positioned between the device isolation lines. Furthermore, a plurality of source lines is formed between neighboring spacers above the source arrays.

According to the self-aligned process of this invention, the source line is dissected by the device isolation line after the substrate doping operation. However, the source line formed above the source array is capable of linking all the individual source-doped regions back together. In addition, resistance of source lines can be lowered by selecting a material having a low resistance such as polysilicon or metal silicide to form the source lines. Hence, concentration of ionic dopants inside the source-doped region can be determined by actual needs instead of considerations concerning source line resistance. Moreover, a low source line resistance permits the reduction of the area required to form source line contact. On the other hand, the linking together of the device isolation structures is capable of reducing the minimal safety distance between the stacked gate and the edge of the device isolation structure. In brief, the invention not only can lower source line resistance leading to an increase in operating speed, but also can increase the level of integration of the flash memory considerably.

It is to be understood that both the foregoing general description and the following detailed description are exemplary, and are intended to provide further explanation of the invention as claimed.

BRIEF DESCRIPTION OF THE DRAWINGS

The accompanying drawings are comprised to provide a further understanding of the invention, and are incorporated in and constitute a part of this specification. The drawings illustrate embodiments of the invention and, together with the description, serve to explain the principles of the invention. In the drawings, FIG 1. is a schematic top view showing a portion off an ETOX flash memory unit;

FIG. 6A is a schematic, cross-sectional view along line VI–VI' of FIG. 5.

DESCRIPTION OF THE PREFERRED EMBODIMENTS

Figure 1:
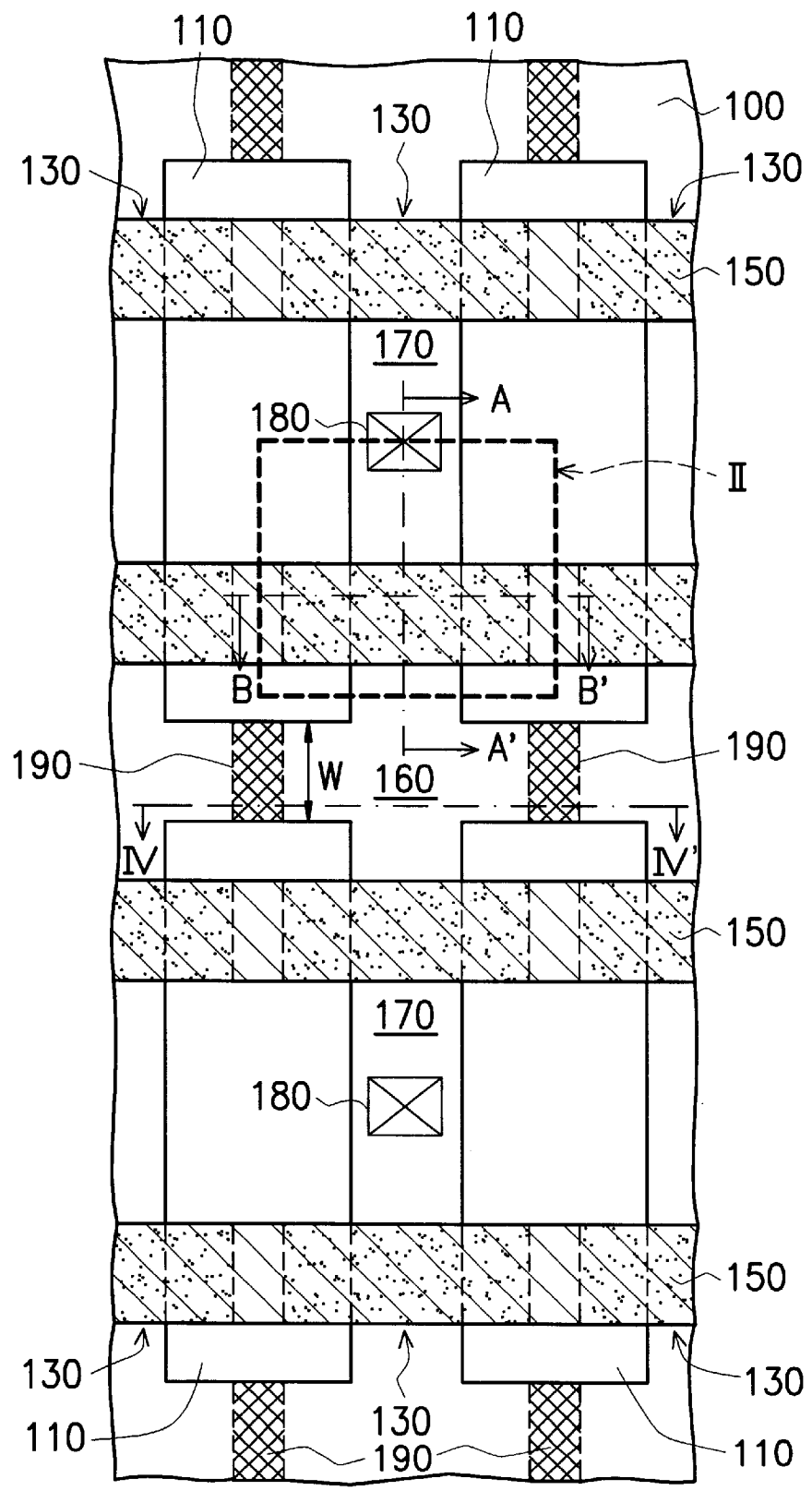
Figure 2A:
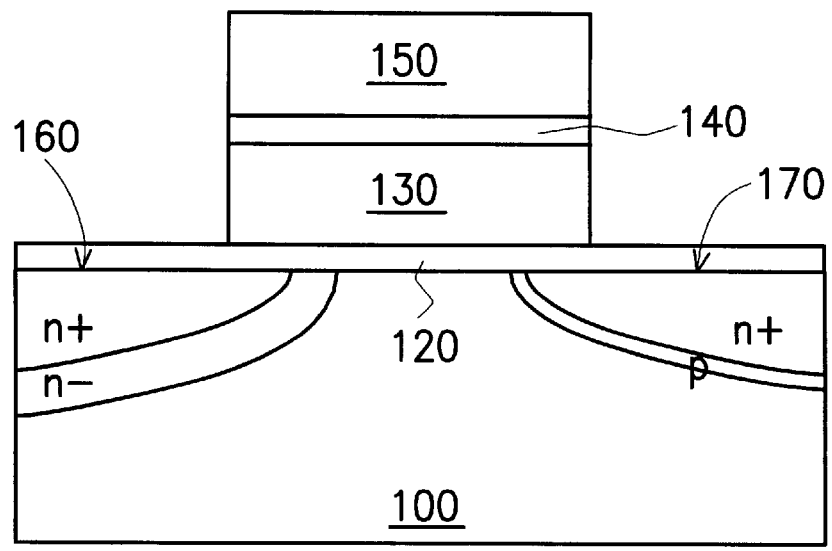
FIG. 2A is a schematic, cross-sectional side view along line A–A' in the central region II of FIG. 1.
Figure 2B:
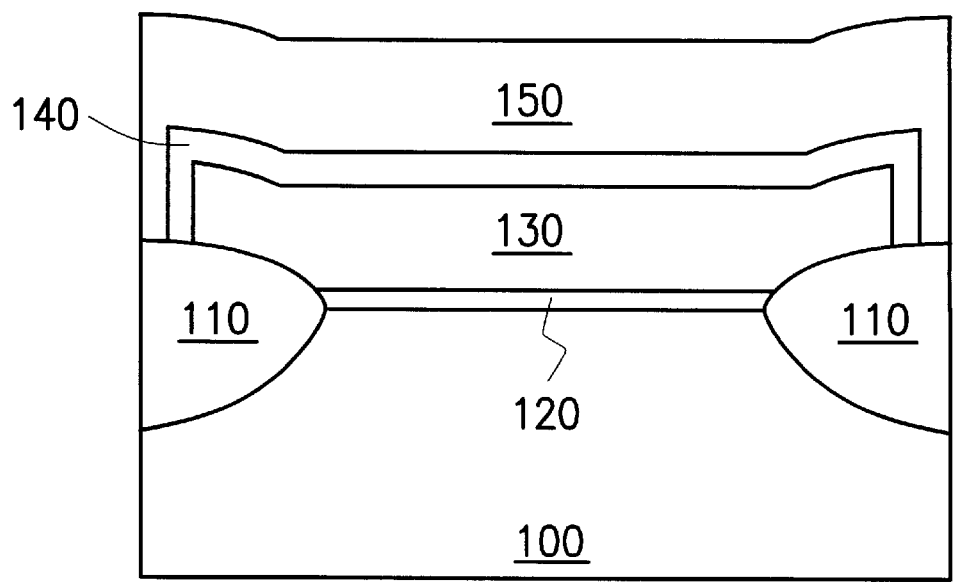
FIG. 2B is another schematic, cross-sectional view along line B–B' in the same central region II of FIG. 1.
Figure 3:
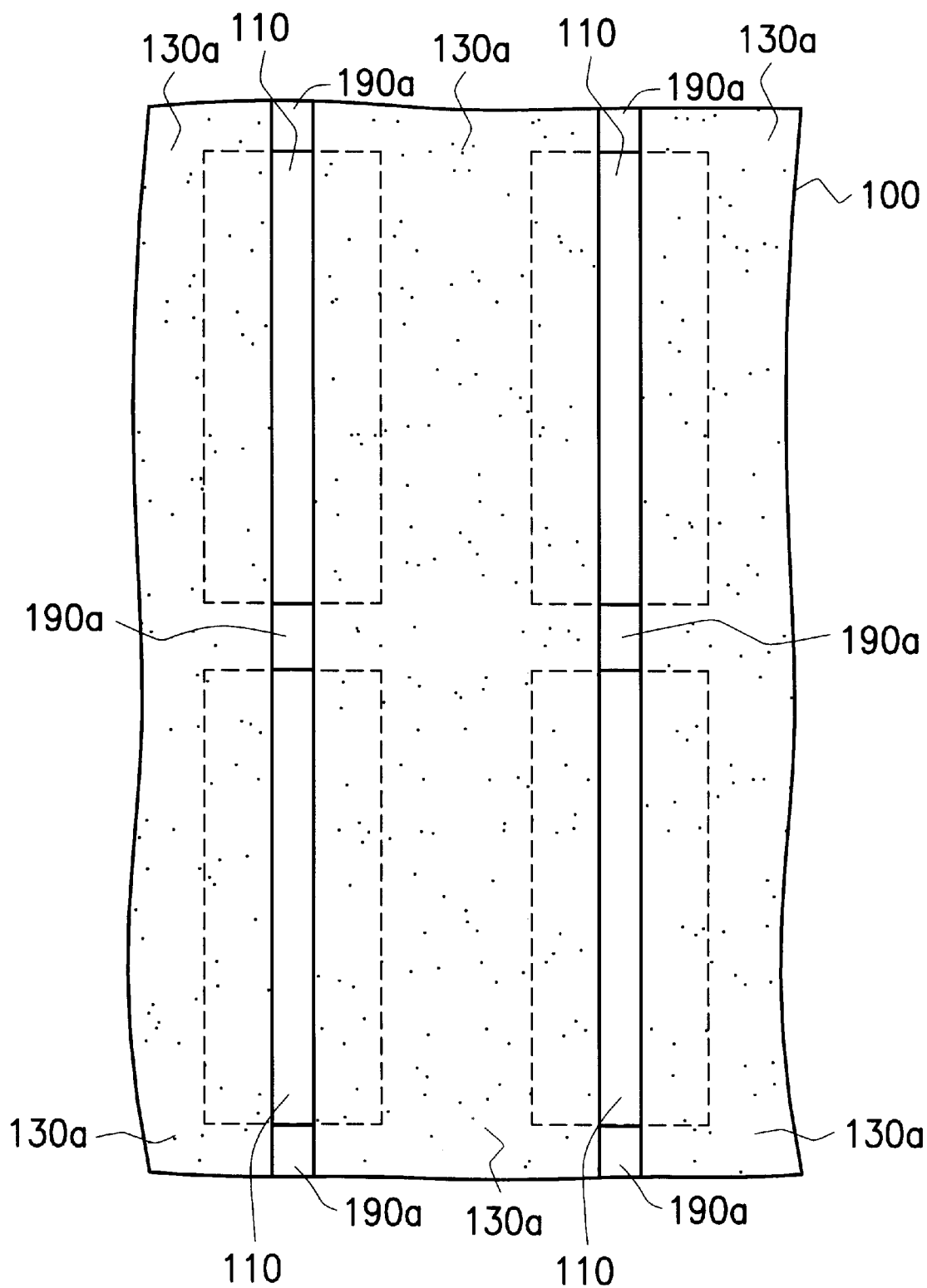
FIG. 3 is a top view showing the intermediate structure after patterning the first polysilicon layer during the fabrication of ETOX flash memory.
Figure 4A:
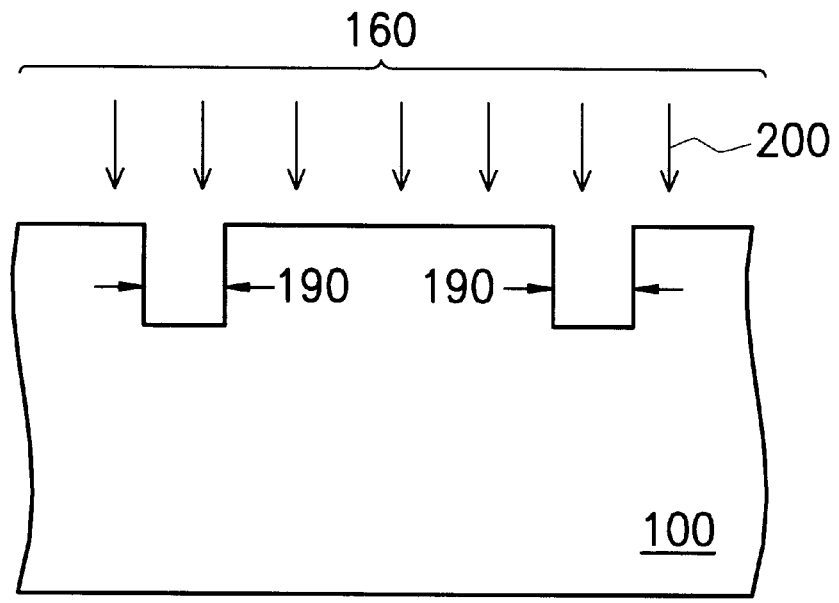
FIGS. 4A and 4B are schematic, cross-sectional views along line IV–IV' of FIG. 1.
Figure 4B:
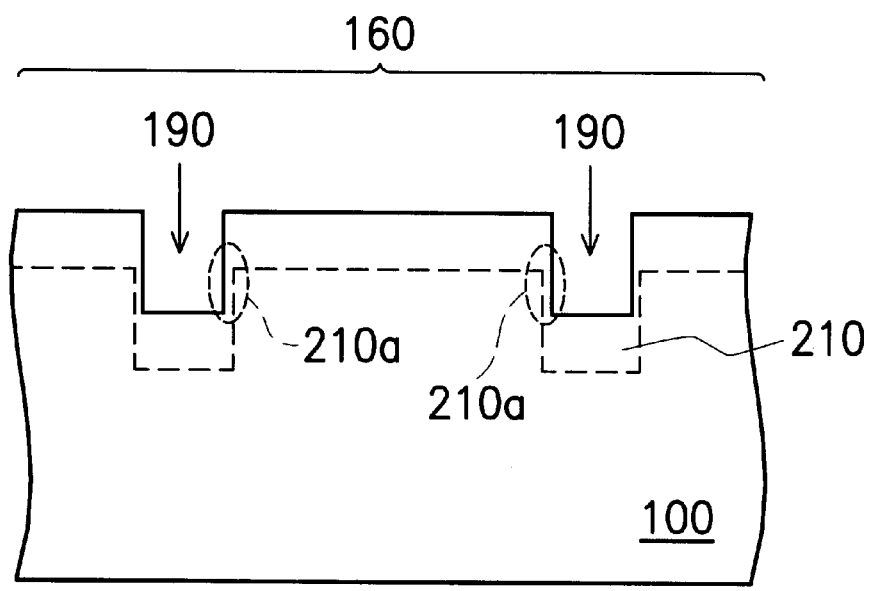

Reference will now be made in detail to the present preferred embodiments of the invention, examples of which are illustrated in the accompanying drawings. Wherever possible, the same reference numbers are used in the drawings and the description to refer to the same or like parts.

Figure 5:
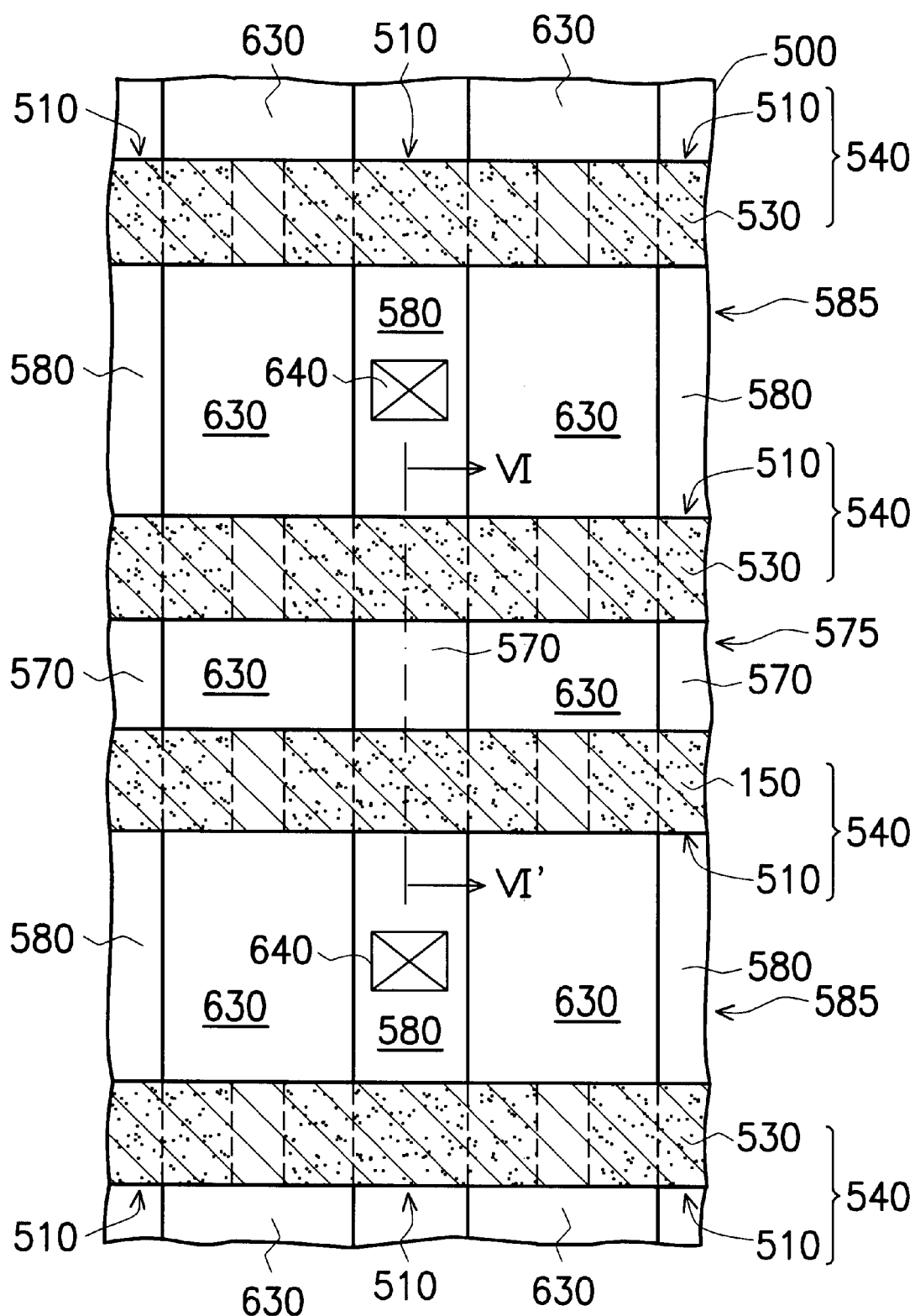
FIG. 5 is a schematic top view showing the layout of a portion of ETOX flash memory according to this invention.

FIG. 5 is a schematic top view showing the layout of a portion of ETOX flash memory according to this invention. As shown in FIG. 5, a plurality of parallel lines 630 for device isolation is formed in a substrate 500. The device isolation lines 630 can be, for example, a shallow trench isolation or field oxide layer. A floating gate 510 and a control gate 530 are formed above the substrate 500. The floating gate 510, the control gate 530 and a dielectric layer (not shown in the figure) located between the two layers together form a stacked gate 540. The stacked gates 540 are parallel to each other and perpendicular to the device isolation structures 630.

Source arrays 575 and drain arrays 585 are formed alternately between the stacked gates 540. Each source array 575 has a plurality of source terminals 570 positioned between the device isolation structures 630. Some of the drain terminals contain bit line contact 640 for connecting the drain terminals 580 to a bit line (not shown in the figure).

The device isolation structure 630 of this invention has a linear shape instead of the conventional multiple-rectangles shape. Compared with the design in FIG. 1, the source line 160 is dissected into several terminals if the linear device isolation structure 630 in FIG. 5 is produced.

Figure 6A:
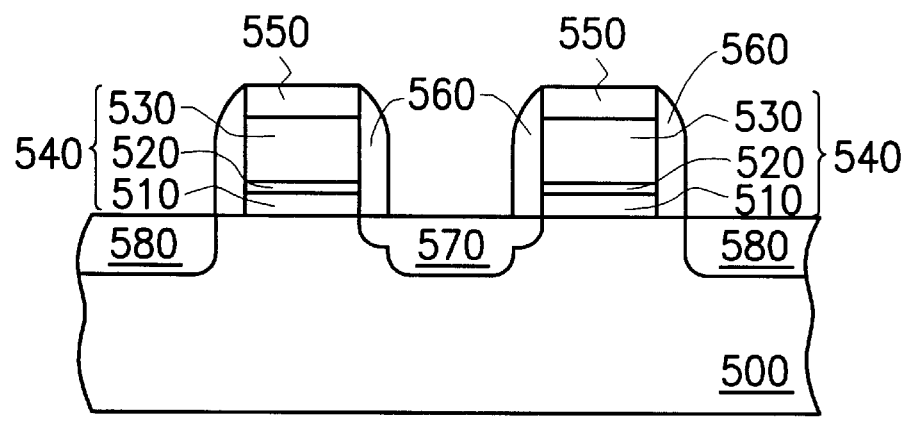
FIGS. 6A through 6C is are schematic, cross-sectional views showing the progression of steps for producing ETOX flash memory according to this invention.
Figure 6B:
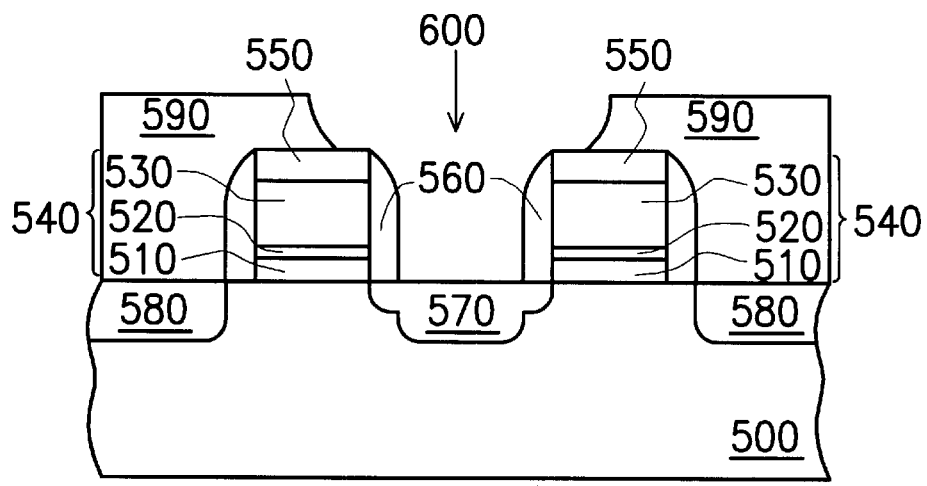
Figure 6C:
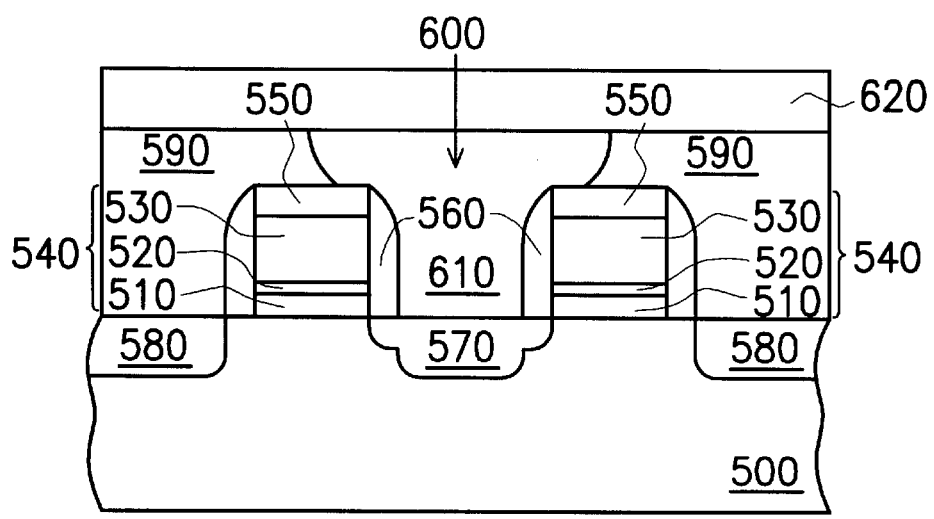

FIGS. 6A through 6C are schematic, cross-sectional views showing the progression of steps for producing ETOX flash memory according to this invention, and FIG. 6A is a schematic, cross-sectional view taken along line VI–VI' of FIG. 5. First, as shown in FIG. 6A, a substrate 500 having stacked gates 540 formed thereon is provided. Each stacked gate comprises a flowing gate 510, a dielectric layer 520 and a control gate 530. The floating gate 510 can be a doped polysilicon layer, the dielectric layer 520 can be an oxide/nitride/oxide (ONO) composite layer and the control gate 530 can be a doped polysilicon layer or a polycide layer, for example.

A cap layer 550 is formed over the stacked gates 540, and spacers 560 are formed on the sidewalls of the stacked gates. The cap layer 550 and the spacers 560 can both be silicon oxide layers formed by, for example, chemical vapor deposition. A source terminal 570 and a drain terminal 580 are formed on each side of the stacked gate 540. The source and drain terminals 570 and 580 are formed by, for example, implanting ions into the exposed substrate 500 while using the stacked gates 540 as a mask.

As shown in FIG. 6B, an insulation layer 590 is formed over the substrate 500. The insulation layer 590 can be a borophosphosilicate glass layer formed by, for example, chemical vapor deposition. The insulation layer 590 is planarized by, for example, chemical-mechanical polishing. The planarized insulation layer 590 is next patterned to form an opening 600 that exposes the source terminal 570, which corresponds to the source array 575 in FIG. 5. The opening 600 is formed by, for example, performing photolithographic and etching operations. In the etching step, an etchant that etches only the insulation layer 590 is preferably selected.

For example, if the insulation layer 590 is a borophosphosilicate glass layer (boron and phosphorus doped silicon oxide) while the cap layer 550 and the spacers 560 are silicon oxide layer, gaseous hydrofluoric acid (HF) can be used to etch the insulation layer 590. According to articles written by N. Miki (Elec. Dev., 37 (1), p107 (1990)) and H. Watanabe (IEDM p259 (1992)), etching rate of gaseous hydrofluoric acid is fastest on a silicon oxide layer that contains both boron and phosphorus dopants. The next fastest is a silicon oxide layer that contains boron or phosphorus dopants, and the slowest is a silicon oxide layer without any dopants. Hence, although the insulation layer 590, the cap layer 550 and the spacers 560 are all principally silicon oxide layers, only the insulation layer 590 is etched. Etching rate of gaseous hydrofluoric acid is so slow that damage to the cap layer 550 and the spacers 560 is avoided.

As shown in FIG. 6C, conductive material is deposited into the opening 600 to form a source line 610. The source line 610 is formed on top of the source array 575 as shown in FIG. 5. The source line 610 can be a doped polysilicon layer formed by, for example, depositing conductive material in chemical vapor deposition followed by etching back or planarizing the conductive layer to remove excess material above the insulation layer 590. To lower the resistance of the source line 610, an additional metal silicide layer may also be formed on top of the doped polysilicon layer by performing a self-aligned silicide process. An insulation layer 620 is formed over the substrate 500. The insulation layer 620 can be a silicon oxide layer formed by, for example, chemical vapor deposition. In the subsequent step, since conventional processes are used to complete the formation of the ETOX flash memory steps, detailed description is not repeated here.

Although the source line is cut into sections by the device isolation structure of this invention, the formation of a source line above the source arrays is capable of linking all the independent source-doped regions together. The advantages of the invention at least include:

1. A low-resistance material such as doped polysilicon or metal silicide can be chosen to form the source lines. Hence, dopant concentration in the source-doped regions can be adjusted according to design instead of according to considerations regarding leakage current and resistance of the source lines.
2. The use of low-resistance material to form the source lines is able to reduce source line resistance and the area needed to form a source line contact. Hence, design restriction of having to form a source line contact for every 32 bits can be waived.
3. By changing the design of the device isolation structure so that the device isolation structures are chained together, a safe distance between the stacked gate and the edge of the device isolation structure can be waived. Therefore, the level of integration of the ETOX flash memory is increased.

In summary, the invention is capable of lowering source line resistance and increasing both the operating efficiency and the level of integration of flash memories.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A self-aligned process of fabricating source lines of an ETOX flash memory, comprising the steps of:
    providing a substrate;
    forming a plurality of parallel device isolation lines in the substrate;
    forming a plurality of parallel stacked gates above the substrate, wherein the stacked gates are perpendicular to the device isolation lines;
    forming a first insulation layer on top of each stacked gate, wherein the first insulation comprises a silicon oxide layer;
    forming a plurality of silicon oxide spacers on sidewalls of the stacked gates;
    forming at least one source array in the substrate between neighboring stacked gates, wherein the source array is parallel to the stacked gates and has a plurality of source-doped regions separately positioned between device isolation lines;
    forming a second insulation layer over the substrate, wherein the second insulation layer comprises a borophosphosilicate glass layer;
    forming an opening in the second insulation layer to expose the device isolation region and the source-doped region cross-over by the source array, wherein the opening is formed by etching the second insulation layer with a gaseous hydrofluoric acid (HF); and
    forming a source line inside the opening.

2. The process of claim 1, wherein the device isolation lines comprise field oxide layers.

3. The process of claim 1, wherein the device isolation lines comprise shallow trench isolation structures.

4. The process of claim 1, wherein the step of forming the source-doped regions comprises implanting ions into the exposed substrate while using the stacked gates as a mask.

5. The process of claim 1, wherein the step of forming the first insulation layer comprises depositing silicon oxide by chemical vapor deposition.

6. The process of claim 1, wherein the step of forming the spacers comprises depositing silicon oxide by chemical vapor deposition.

7. The process of claim 1, wherein the step of forming the source lines comprises depositing doped polysilicon by chemical vapor deposition.

8. The process of claim 7, wherein the step of forming the source lines further comprises performing a self-aligned silicide process to form a metal silicide layer over the doped polysilicon lines.

* * * * *